(12) United States Patent
Malinowski et al.

(10) Patent No.: US 11,362,177 B2
(45) Date of Patent: Jun. 14, 2022

(54) EPITAXIAL SEMICONDUCTOR MATERIAL REGIONS FOR TRANSISTOR DEVICES AND METHODS OF FORMING SAME

(71) Applicant: GLOBALFOUNDRIES U.S. Inc., Santa Clara, CA (US)

(72) Inventors: Arkadiusz Malinowski, Dresden (DE); Baofu Zhu, Hillsboro, OR (US); Frank W. Mont, Troy, NY (US); Ali Razavieh, Albany, NY (US); Julien Frougier, Albany, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 141 days.

(21) Appl. No.: 16/774,157

(22) Filed: Jan. 28, 2020

(65) Prior Publication Data

US 2021/0233999 A1 Jul. 29, 2021

(51) Int. Cl.
*H01L 29/08* (2006.01)
*H01L 29/06* (2006.01)
*H01L 29/78* (2006.01)

(52) U.S. Cl.
CPC ...... *H01L 29/0843* (2013.01); *H01L 29/0653* (2013.01); *H01L 29/7848* (2013.01)

(58) Field of Classification Search
CPC ................ H01L 29/0843; H01L 29/0653
See application file for complete search history.

(56) References Cited

U.S. PATENT DOCUMENTS

| | | | |
|---|---|---|---|
| 7,696,568 B2 | 4/2010 | Hwang et al. | |
| 8,236,659 B2 | 8/2012 | Tsai et al. | |
| 8,497,180 B2 | 7/2013 | Javorka et al. | |
| 9,064,961 B2 | 6/2015 | Wasyluk et al. | |
| 9,299,776 B2 | 3/2016 | Grivna et al. | |
| 9,362,383 B1* | 6/2016 | Balakrishnan | .... H01L 29/66795 |

(Continued)

OTHER PUBLICATIONS

Malinowski et al., "What is Killing Moore's Law? Challenges in Advanced FinFET Technology Integration," Proceedings of the 26th International Conference "Mixed Design of Integrated Circuits and Systems," Jun. 27-29, 2019.

(Continued)

*Primary Examiner* — Moin M Rahman
*Assistant Examiner* — Mohammad A Rahman
(74) *Attorney, Agent, or Firm* — Francois Pagette; Hoffman Warnick LLC

(57) ABSTRACT

One illustrative transistor of a first dopant type disclosed herein includes a gate structure positioned above a semiconductor substrate and first and second overall epitaxial cavities formed in the semiconductor substrate on opposite sides of the gate structure. The device also includes a counter-doped epitaxial semiconductor material positioned proximate a bottom of each of the first and second overall epitaxial cavities, wherein the counter-doped epitaxial semiconductor material is doped with a second dopant type that is opposite to the first dopant type, and a same-doped epitaxial semiconductor material positioned in each of the first and second overall epitaxial cavities above the counter-doped epitaxial semiconductor material, wherein the same-doped epitaxial semiconductor material is doped with a dopant of the first dopant type.

13 Claims, 18 Drawing Sheets

(56) References Cited

U.S. PATENT DOCUMENTS

| | | |
|---|---|---|
| 9,419,082 B2 | 8/2016 | Mishra et al. |
| 9,490,348 B2 | 11/2016 | Ching et al. |
| 9,812,573 B1 | 11/2017 | Malinowski et al. |
| 2012/0025266 A1* | 2/2012 | Griebenow ........ H01L 29/66651 |
| | | 257/190 |
| 2012/0161238 A1 | 6/2012 | Scheiper et al. |
| 2013/0082309 A1 | 4/2013 | Su et al. |
| 2014/0217519 A1* | 8/2014 | Qin ..................... H01L 29/7848 |
| | | 438/300 |
| 2015/0097197 A1 | 4/2015 | Ganz et al. |
| 2017/0294522 A1 | 10/2017 | Pandey et al. |
| 2019/0013402 A1 | 1/2019 | Singh et al. |
| 2019/0035908 A1* | 1/2019 | Liao ................ H01L 21/823842 |

OTHER PUBLICATIONS

U.S. Appl. No. 15/960,965, filed Apr. 24, 2018, entitled "Methods, Apparatus, and System for Reducing Leakage Current in Semiconductor Devices".

* cited by examiner

EPITAXIAL SEMICONDUCTOR MATERIAL REGIONS FOR TRANSISTOR DEVICES AND METHODS OF FORMING SAME

BACKGROUND

Field of the Invention

The present disclosure generally relates to various embodiments of novel epitaxial semiconductor material regions for transistor devices and methods of making such regions.

Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either N-type (NFET) or P-type (PFET) devices, wherein the "N" and "P" designation is based upon the type of dopants used to create the source/drain regions of the devices. So-called CMOS (Complementary Metal Oxide Semiconductor) technology or products refers to integrated circuit products that are manufactured using both NFET and PFET transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region of the transistor.

Device designers are under constant pressure to increase the performance of transistor devices as well as increase packing densities in IC products. Device designers sometimes focus on trying to increase the magnitude of the current when the transistor is "ON"—Ion—while also trying to decrease the magnitude of the current flowing through the transistor when the transistor is turned "OFF"—Ioff. However, in advanced CMOS integrated circuit products, improving on-state drive current (Ion) while avoiding substantial increases in the off-state current (Ioff) can be very challenging. For example, in the case of FinFET devices, aggressive fin pitch scaling has resulted in smaller volumes of epitaxial semiconductor material being formed on the portions of the fins that are located in the source/drain regions. As a result, the amount of desirable stress (tensile for NFET devices and compressive for PFET devices) that can be imparted to the channel region of the transistor device from the epitaxial semiconductor material that is formed on the fins in the source/drain regions is reduced.

Devices designers have also employed various techniques to control or "tune" the threshold voltage of various transistor devices. One technique involves modifying so-called halo implant processes on certain devices to achieve a desired change in the threshold voltage of a transistor. However, due to aggressive scaling of the gate pitch on advanced IC products, the use of halo implants to modulate the threshold voltage of the transistor device becomes problematic. For advanced transistor devices whose gate structure is made by performing known replacement gate processes, another technique involved forming additional layers of material in one of the device types (N or P) to vary the threshold voltage level. However, as the gate structures have been reduced in size due to aggressive scaling, it become ever more difficult to form additional materials in the replacement gate cavity during the replacement gate process. The present disclosure is generally directed to various embodiments of novel epitaxial semiconductor material regions for transistor devices and methods of making such regions.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of novel epitaxial semiconductor material regions for transistor devices and methods of making such epitaxial semiconductor material regions. One illustrative transistor of a first dopant type disclosed herein includes a gate structure positioned above a semiconductor substrate and first and second overall epitaxial cavities formed in the semiconductor substrate on opposite sides of the gate structure. The device also includes a counter-doped epitaxial semiconductor material positioned proximate a bottom of each of the first and second overall epitaxial cavities, wherein the counter-doped epitaxial semiconductor material is doped with a second dopant type that is opposite to the first dopant type, and a same-doped epitaxial semiconductor material positioned in each of the first and second overall epitaxial cavities above the counter-doped epitaxial semiconductor material, wherein the same-doped epitaxial semiconductor material is doped with a dopant of the first dopant type.

BRIEF DESCRIPTION OF THE DRAWINGS

The disclosure may be understood by reference to the following description taken in conjunction with the accompanying drawings, in which like reference numerals identify like elements, and in which.

Figure 1:
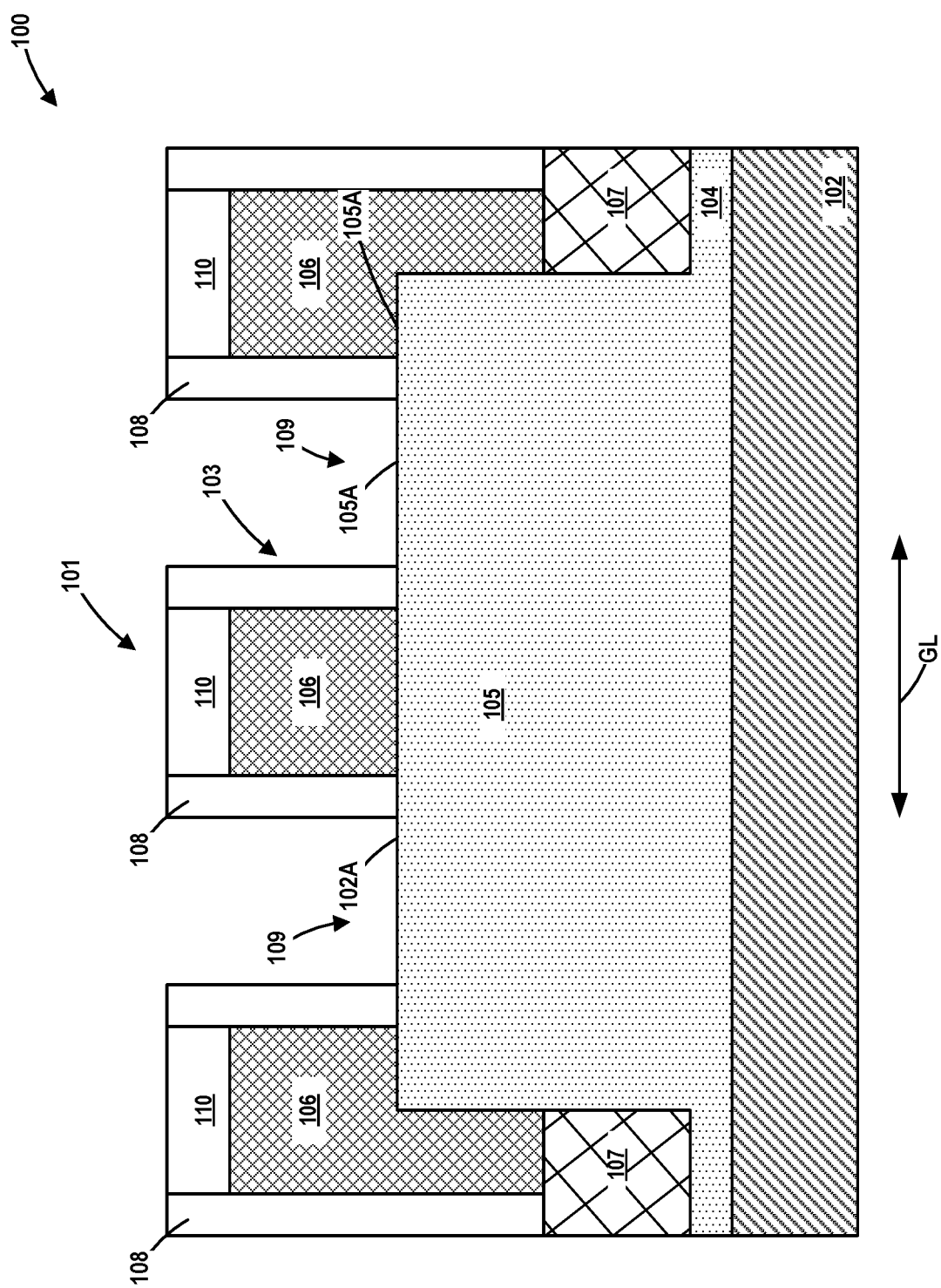
FIGS. 1-18 depict various embodiments of novel epitaxial semiconductor material regions for transistor devices and methods of making such epitaxial semiconductor material regions. It should be noted that the attached drawings are not to scale.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-17 depict various embodiments of an integrated circuit (IC) product 100 that includes a transistor device 101 with novel epitaxial semiconductor material regions and methods of making such epitaxial semiconductor material regions. As will be appreciated by those skilled in the art after a complete reading of the present application, the transistor devices 101 disclosed herein may be an N-type or a P-type device and they may be formed on a bulk semiconductor substrate or a semiconductor-on-insulator substrate. Moreover, the transistor devices 101 disclosed herein may come in a variety of different forms, e.g., a planar device, a FinFET device, etc. Additionally, the gate structure of the transistor devices 101 disclosed herein may be manufactured using known gate-first or replacement gate manufacturing techniques. For purposes of disclosure only, the transistor devices 101 described below will be FinFET devices that are formed above a bulk semiconductor substrate 102, wherein the gate structure of the transistor device 101 is formed by performing known replacement-gate manufacturing techniques. However, as noted above, the various inventions disclosed herein should not be considered to be limited to the particular example shown in the attached drawings and described below.

FIG. 1 depicts the IC product 100 after several steps were performed to form the transistor device 101 above the bulk semiconductor substrate 102. FIG. 1 depicts the transistor device 101 after an illustrative fin 105, with an upper surface 105A, was formed in the semiconductor substrate 102 by performing traditional manufacturing techniques. Of course, the transistor device 101 may comprise any number of fins 105. In the case where the transistor device 101 is a planar device, the upper surface 105A would correspond to the upper surface 102A of the substrate 102. Thus, as used herein and in the appended claims, reference to the upper surface of a semiconductor substrate should be understood to include the upper surface of a fin, when the device is a FinFET device, as well as the uppermost surface of the semiconductor substrate when the device is a planar transistor device. As noted above, the transistor device 101 may also be formed on a semiconductor-on-insulator (SOI) substrate that includes a base semiconductor layer, a buried insulation layer and an active semiconductor layer positioned above the buried insulation layer, wherein transistor devices are formed in and above the active semiconductor layer. The substrate (irrespective of its form) may be made of silicon or it may be made of semiconductor materials other than silicon, e.g. germanium, SiGe, an III-V material, etc. Thus, the terms "substrate" or "semiconductor substrate" should be understood to coverall semiconducting materials and all forms of such materials. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application.

FIG. 1 depicts the transistor device 101 after several process operations were performed. In one illustrative process flow, after forming and cutting the fin(s) 105 to the desired length, an isolation structure 107 was formed in the substrate 102 by performing known etching, deposition and planarization techniques. The isolation structure 107 may be comprised of a variety of different materials, e.g., silicon dioxide, etc. Thereafter, a doped well region 104 was formed in the fin 105/substrate 102 by performing known ion implantation techniques. The doping of the well region 104 depends upon the type (N or P) of the transistor device 101. In the case where the transistor device 101 is a P-type transistor, the well region 104 will be doped with an N-type dopant. In the case where the transistor device 101 is an N-type transistor, the well region 104 will be doped with a P-type dopant. The concentration of the dopant material in the well region 104 may vary depending upon the particular application. The gate length (GL) direction, or current-transport direction, of the transistor device 101 is depicted in the drawings.

As noted above, in the particular example depicted herein, the gate structure of the transistor device 101 will be formed by performing known replacement-gate manufacturing techniques. Accordingly, FIG. 1 depicts a sacrificial gate structure 106, a gate cap 110 and a sidewall spacer 108 positioned adjacent the sacrificial gate structure 106. Collectively, the sacrificial gate structure 106, the gate cap 110 and the sidewall spacer 108 define a gate 103. As is common, the sacrificial gate structure 106 typically comprises a layer of sacrificial gate insulation material (not separately shown), e.g., silicon dioxide, and a layer of sacrificial gate electrode material (not separately shown), e.g., amorphous silicon, polysilicon, etc. The gate cap 110 may be comprised of a material such as silicon nitride. The techniques for forming the sacrificial gate structure 106 and the gate cap 110 are well known to those skilled in the art. After formation of the sacrificial gate structure 106 and the gate cap 110, the simplistically depicted sidewall spacer 108 was formed around and adjacent the entire perimeter of the sacrificial gate structure 106. Although only a single sidewall spacer 108 is depicted in the drawings, in practice, more than one sidewall spacer may be formed adjacent the sacrificial gate structure 106. The sidewall spacer 108 may be formed by depositing a conformal layer of spacer material (not shown) above the substrate 102 and thereafter performing an anisotropic etching process to remove horizontally positioned portions of the layer of spacer material. The spacer 108 may be of any desired thickness (as measured at its base) and it may be comprised of a variety of different materials, e.g., silicon dioxide, a low-k material, silicon nitride, SiCN, SiBCN, SiN, SiCO, and SiOCN, etc. Source/drain regions 109 will be formed in the substrate 102 between the spacers 108 on the gate structures 106.

Figure 2:
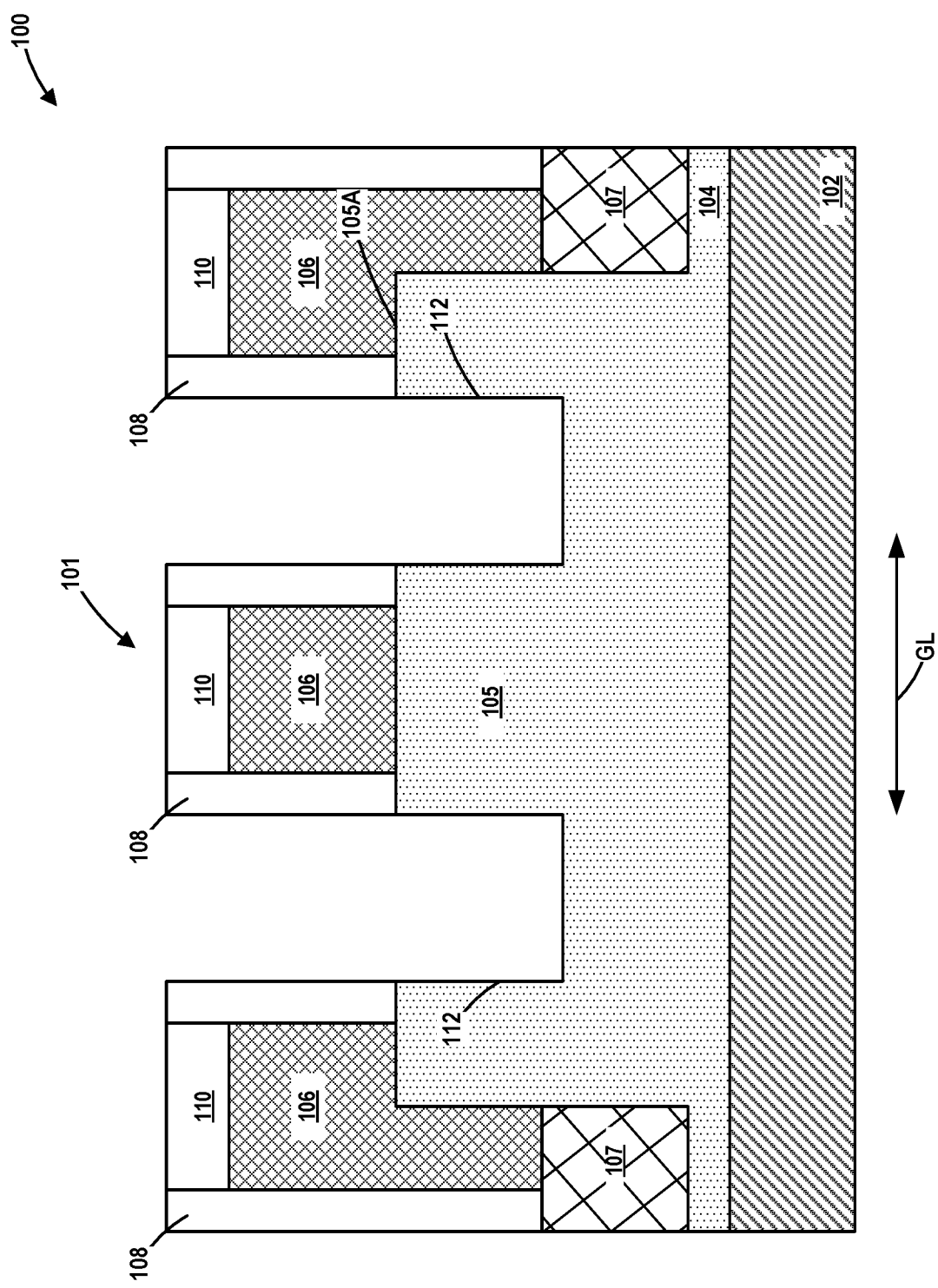

As will be described more fully below, various process operations will be performed to form first and second overall epitaxial cavities 121 in the semiconductor substrate 102 on opposite sides of the gate structure 106. Each of the first and second overall epitaxial cavities 121 has the same basic configuration. Accordingly, FIG. 2 depicts the transistor device 101 after a first etching process, e.g., an anisotropic etching process, was performed to form a plurality of upper epitaxial cavities 112 in the fin 105. The depth of the upper epitaxial cavities 112 may vary depending upon the particular application. In one illustrative embodiment, based upon current-day technology, the depth of the upper epitaxial cavities 112 below the upper surface 105A of the fin 105 may be about 40-60 nm. In the presently disclosed example, the upper epitaxial cavities 112 are substantially vertically oriented and substantially self-aligned with respect to the adjacent sidewall spacers 108.

Figure 3:
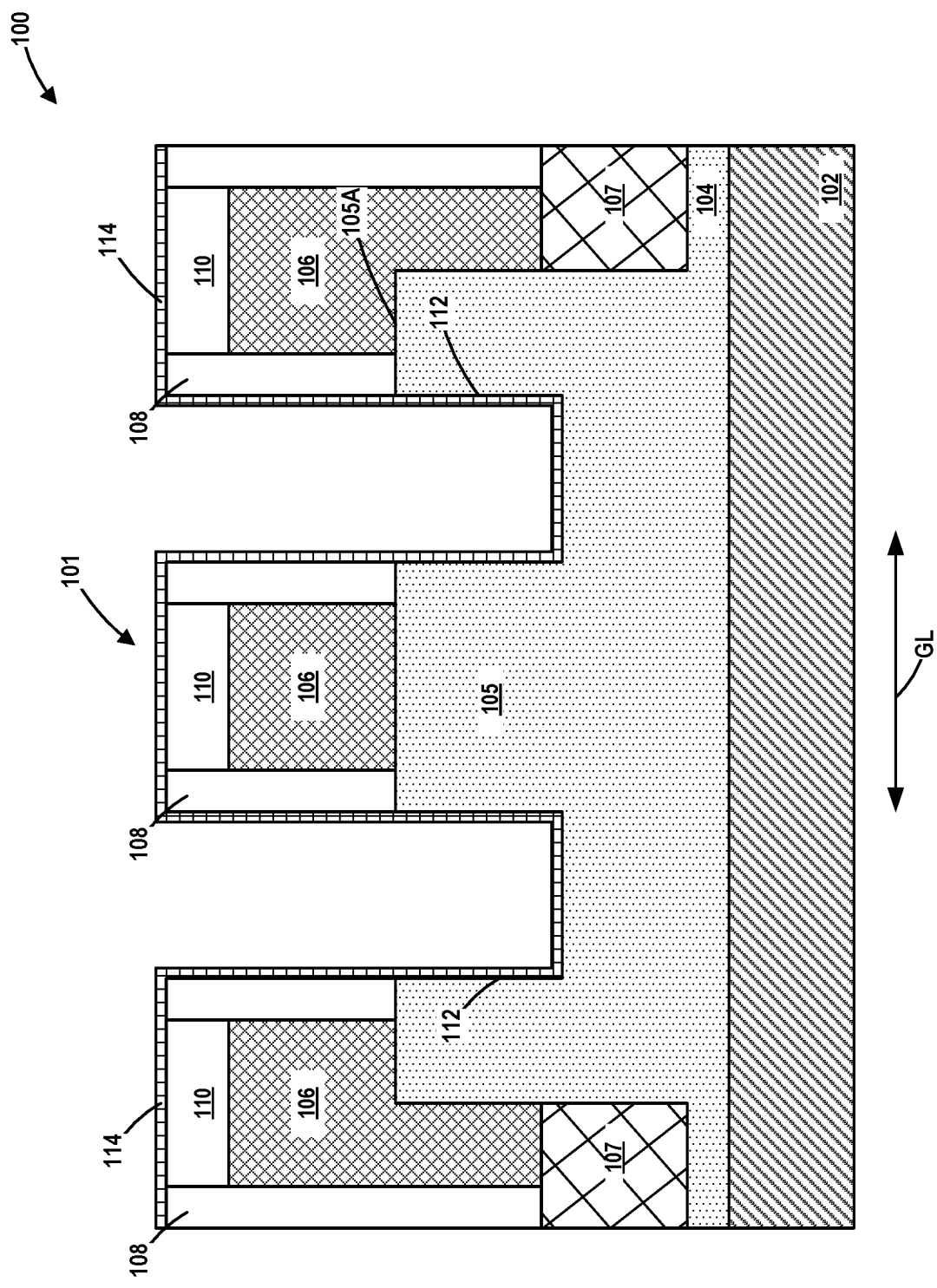

FIG. 3 depicts the transistor device 101 after a conformal deposition process was performed to form a conformal layer of insulating material 114 on the product 100 and within the upper epitaxial cavities 112. The conformal layer of insulating material 114 may be comprised of a variety of different materials, e.g., silicon dioxide, silicon nitride, and it may be formed to any desired thickness, e.g., 4-5 nm, based upon current-day technology.

Figure 4:
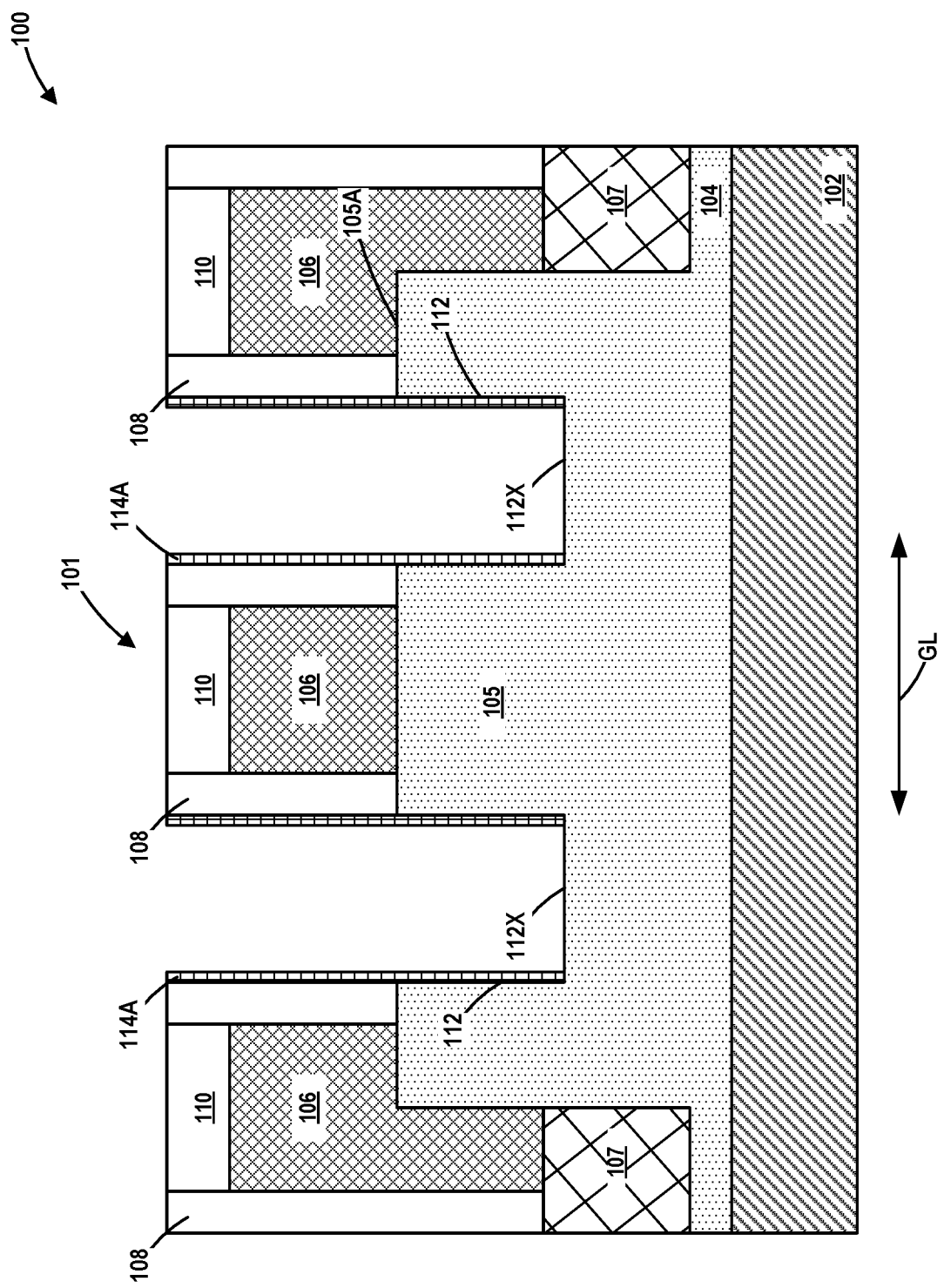

FIG. 4 depicts the transistor device 101 after an anisotropic etching process was performed on the conformal layer of insulating material 114 so as to remove substantially horizontally oriented portions of the conformal layer of insulating material 114. This operation results in the formation of a sacrificial internal sidewall spacer 114A within each of the upper epitaxial cavities 112. Note that, after formation of the internal sidewall spacer 114A, the bottom surface 112X of each of the upper epitaxial cavities 112 is exposed.

Figure 5:
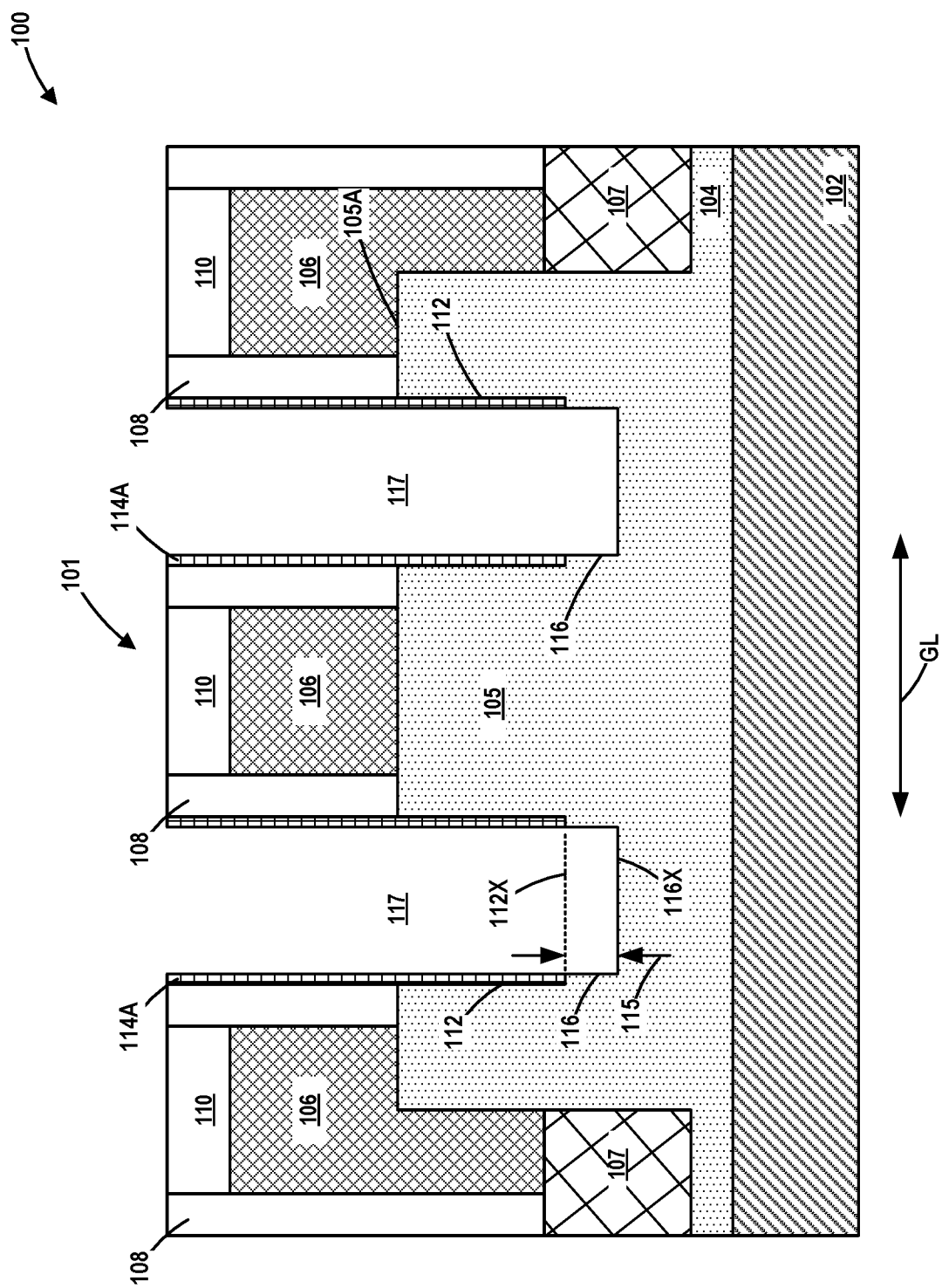

FIG. 5 depicts the transistor device 101 after another anisotropic etching process was performed to form another epitaxial cavity 116 below each of the upper epitaxial cavities 112. As depicted, in one illustrative embodiment, the epitaxial cavities 116 are substantially self-aligned with respect to the internal sidewall spacer 114A within each of the upper epitaxial cavities 112, and the epitaxial cavities 116 effectively extend the depth of the upper epitaxial cavities 112. The epitaxial cavities 116 have a bottom surface 116X that is positioned at a level within the substrate 102 below the bottom surface 112X of the upper epitaxial cavities 112. In one illustrative example, the difference 115 in the vertical position of the bottom surface 112X of the upper epitaxial cavities 112 and the bottom surface 116X of the epitaxial cavities 116 may be about 10-20 nm, based upon current-day technology.

Figure 6:
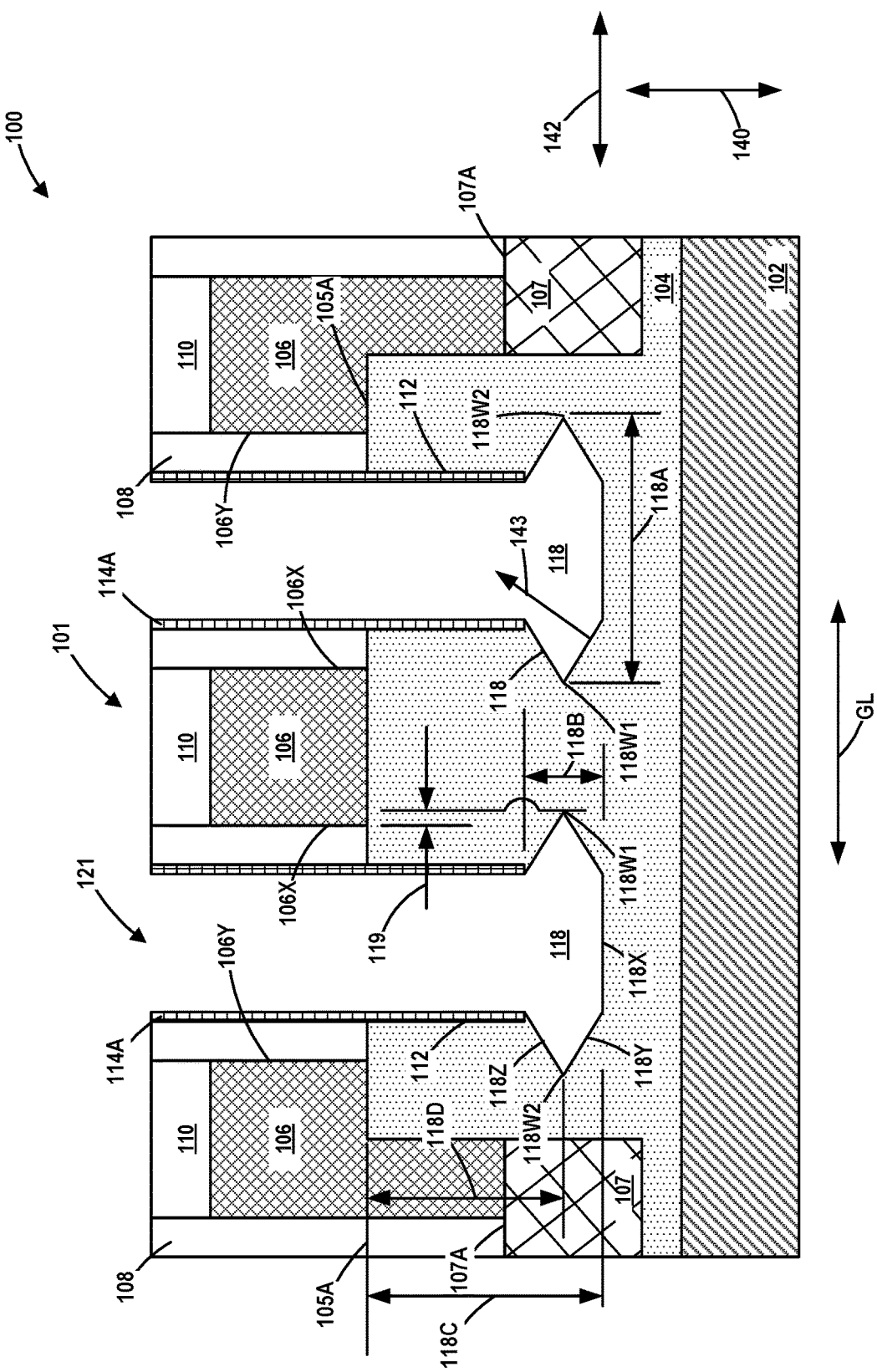

FIG. 6 depicts the transistor device 101 after a crystallographic wet etch process was performed. Such an etching process may be performed using an etchant such as TMAH (tetramethylammoniumhydroxide), KOH, etc. This process operation results in the formation of a lower epitaxial cavity 118 at the bottom of each of the upper epitaxial cavities 112. In one illustrative embodiment, the lower epitaxial cavity 118 may have a sigma-shaped (or diamond-shaped) cross-sectional configuration in a cross-section taken through the lower epitaxial cavity 118 in a direction corresponding to the gate length direction of the transistor device 101. The silicon substrate 102 has a crystalline structure wherein the <100> crystal direction is indicated by the double arrow 140, the <110> crystal direction is indicated by the double arrow 142 and the <111> crystal direction (normal to the faceted surface 118Y) is indicated by the arrow 143. As will be appreciated by those skilled in the art, such a TMAH or KOH based wet etch process can have a substantially greater etch rate in the <100> crystal direction than in the <111> crystal direction. As depicted, the lower epitaxial cavities 118 may have a substantially planar bottom surface 118X and inclined or faceted surfaces 118Y and 118Z that meet at an apex that will collectively be referenced using the designation 118W. The apexes 118W have been labeled 118W1 and 118W2 for reference purposes. Of course, as will be appreciated by those skilled in the art after a complete reading of the present application, the overall size and configuration of the lower epitaxial cavities 118 may vary depending upon the particular application and is not limited to the illustrative sigma-shape (or diamond-shape) cross-sectional configuration depicted in FIG. 6, as the lower epitaxial cavities 118 may have a variety of different configurations.

In the depicted example, the upper epitaxial cavity 112 extends from the surface 105A of the fin 105 to the lower epitaxial cavity 118. Each of the first and second overall epitaxial cavities 121 comprises an upper epitaxial cavity 112 and a lower epitaxial cavity 118.

Figure 18:
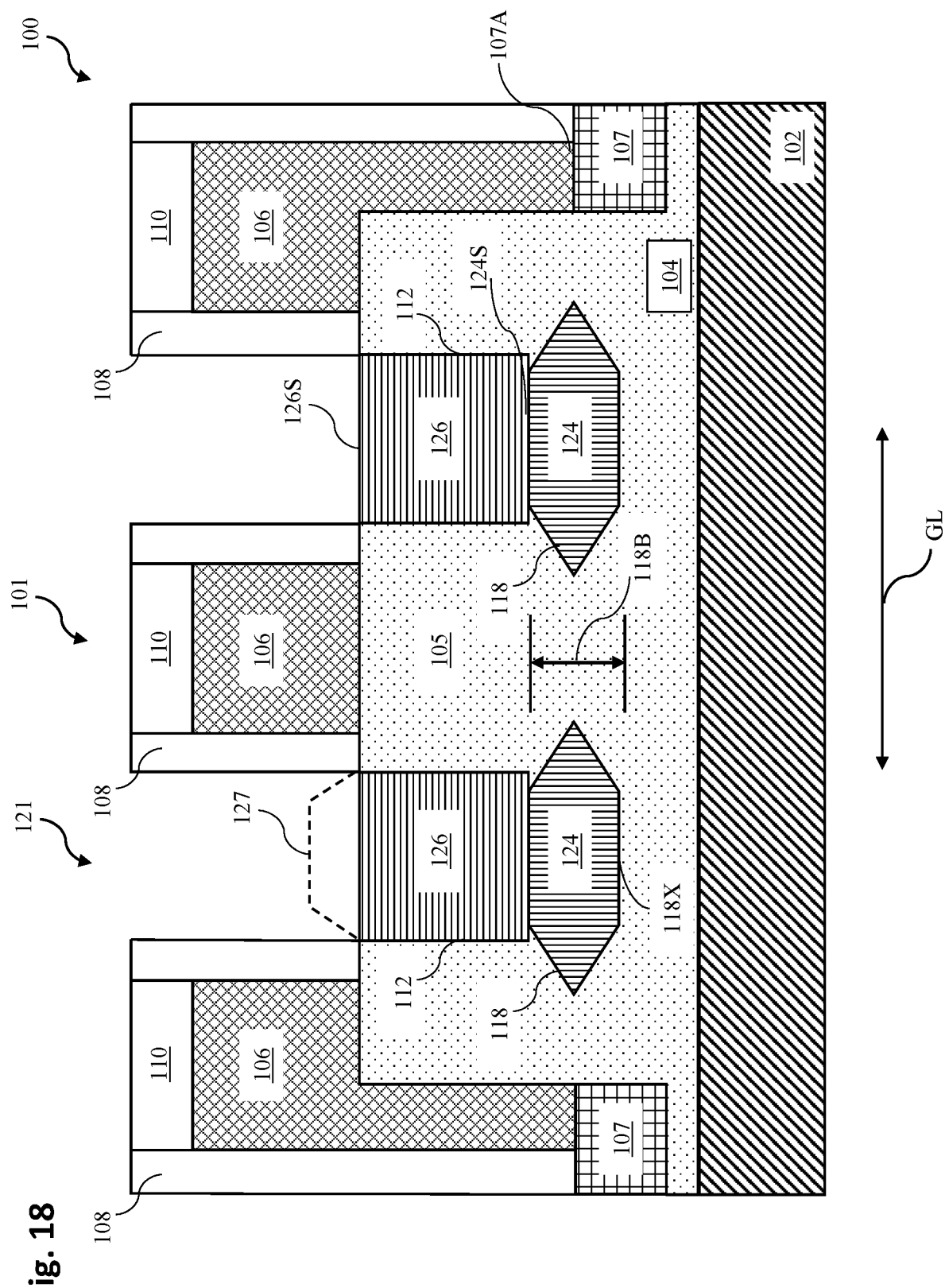

The physical size and resulting positioning of the illustrative sigma-shaped lower epitaxial cavities 118 relative to other structures or features on the IC product 100 may vary depending upon the particular application. Accordingly, the following illustrative dimensions are provided only by way of example based upon current-day technology, and such dimensional examples should not be considered to be limitations to the various inventions disclosed herein. The lower epitaxial cavities 118 have an overall width 118A (in the gate length direction) and an overall height or vertical thickness 118B. In one illustrative example, the overall width 118A may be about 30-60 nm and the overall height or vertical thickness 118B may be about 10-20 nm. The bottom surface 118X of the lower epitaxial cavities 118 may be positioned a distance 118C of about 50-80 nm below the upper surface 105A of the fin 105. The apex 118W of the lower epitaxial cavities 118 may be positioned a distance 118D of about 45-70 nm below the upper surface 105A of the fin 105. In one particularly illustrative example, the apex 118W1 of each of the lower epitaxial cavities 118 may extend under the sidewalls 106X of the gate structure 106 of the transistor 101 by a distance 119. In one illustrative example, the dimension 119 may be about 1-10 nm. As depicted, the opposite apex 118W2 of each of the lower epitaxial cavities 118 may extend under the sidewall 106Y of the adjacent gate structures as well. In other applications, the apex 118W of each of the lower epitaxial cavities 118 may not extend under the sidewalls 106X of the gate structure 106 at all. Note that the lateral width of the lower epitaxial cavity 118 in the gate length direction of the transistor device 101 is greater than the lateral width of the substantially vertically oriented upper epitaxial cavity 112 in the gate length direction of the transistor device 101. The vertical distance between the upper surface 107A of the isolation structure 107 and the uppermost surface of the lower epitaxial cavity 118, e.g., at the bottom of the internal spacer 114A may be about 0-15 nm in one illustrative example. Additionally, the vertical distance between the upper surface 107A of the isolation structure 107 and the apexes 118W of the lower epitaxial cavity 118 may be about 0-40 nm in one illustrative example. In one particular example, the upper surface 107A of the isolation structure 107 that is positioned adjacent the lower epitaxial cavity 118 may be aligned, i.e., substantially level, with the apex 118W2 of the lower epitaxial cavity 118. In some applications, the upper surface 107A of the isolation structure 107 may be positioned at a location that is approximately level with a midpoint of the vertical thickness 118B of the lower epitaxial cavity 118, as shown in FIG. 18. Positioning the upper surface 107A of the isolation structure 107 relative to the lower epitaxial cavity 118 as described in the previous two sentences may lead to improved device performance.

Figure 7:
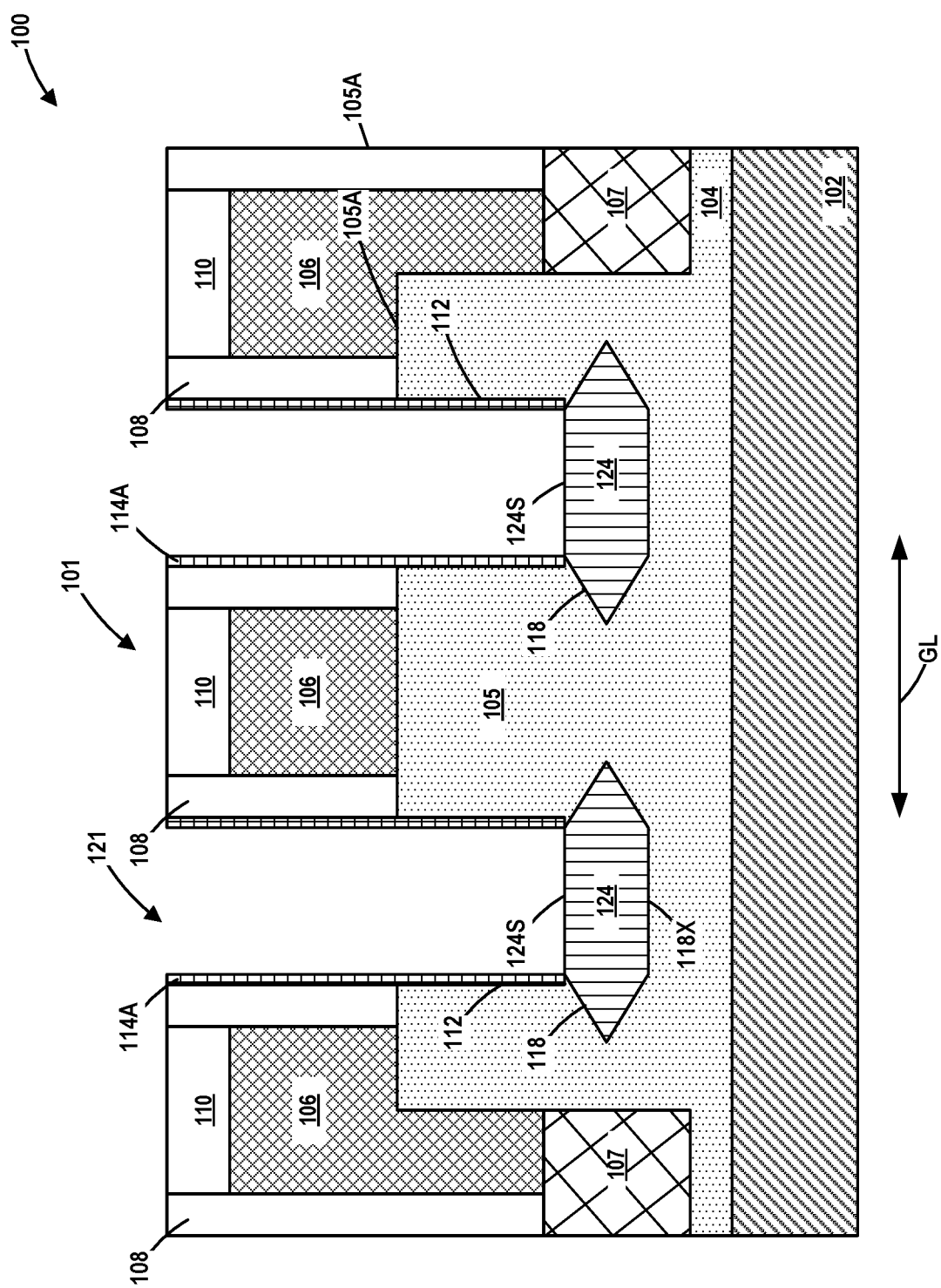

FIG. 7 depicts the transistor device 101 after several process operations were performed. First, a light epitaxy pre-cleaning process was performed to clean the lower epitaxial cavities 118 of the first and second overall epitaxial cavities 121. Some erosion of the internal sidewall spacer 114A within each of the upper epitaxial cavities 112 may occur during this epitaxy pre-cleaning process, but the internal sidewall spacer 114A is sufficiently thick so that a portion of the thickness of the internal sidewall spacer 114A will still be positioned in the upper epitaxial cavities 112 at the conclusion of the epitaxy pre-cleaning process. Thereafter, an epitaxial growth process was performed to form simplistically depicted stressed epitaxial semiconductor material 124 in the lower epitaxial cavities 118 of the first and second overall epitaxial cavities 121. The epitaxial material 124 may be formed with any desired type of stress, e.g., (tensile for NFET devices or compressive for PFET devices). Due to the presence of the internal sidewall spacer 114A, the epitaxial semiconductor material 124 does not form on the sidewall of the upper epitaxial cavities 112. In the depicted example, the epitaxy growth process is controlled such that the upper surface 124S of the epitaxial semiconductor material 124 is approximately level with the bottom of the internal spacer 114A. Of course, in other applications, the epitaxial growth process may be performed in such a manner that the upper surface 124S is slightly above or slightly below the bottom of the internal spacer 114A.

The epitaxial semiconductor material 124 may comprise any of a variety of different semiconductor materials. For example, for a PFET transistor device 101, the epitaxial semiconductor material 124 may comprise silicon, etc. For an NFET transistor device 101, the epitaxial semiconductor material 124 may also comprise silicon, etc. However, the epitaxial semiconductor material 124 in the lower epitaxial cavities 118 will be doped with a dopant type that is opposite to the type (N or P) of the transistor device 101. For example, in the case where the transistor device 101 is a PFET device, the epitaxial semiconductor material 124 will be doped with an N-type dopant, e.g., phosphorus, arsenic. In the case where the transistor device 101 is an NFET device, the epitaxial semiconductor material 124 will be doped with a P-type dopant, e.g., boron, boron difluoride. Stated another way, the epitaxial semiconductor material 124 will be doped with a dopant type (N or P) that is the same as the dopant type (N or P) that is used to dope the well region 104, but different dopant species or materials may be employed in doping the epitaxial semiconductor material 124 and the well region 104. The counter-doped epitaxial semiconductor material 124 may be doped in situ, i.e., during the epitaxial growth process, or it may be doped by performing an ion implantation process. The concentration of dopant atoms in the counter-doped epitaxial semiconductor material 124 as well as the location of peak concentration of dopant atoms within the counter-doped epitaxial semiconductor material 124 may vary depending upon the particular application. In one illustrative example, the location of peak dopant concentration may be at approximately the mid-thickness location of the counter-doped epitaxial semiconductor material 124.

Figure 8:
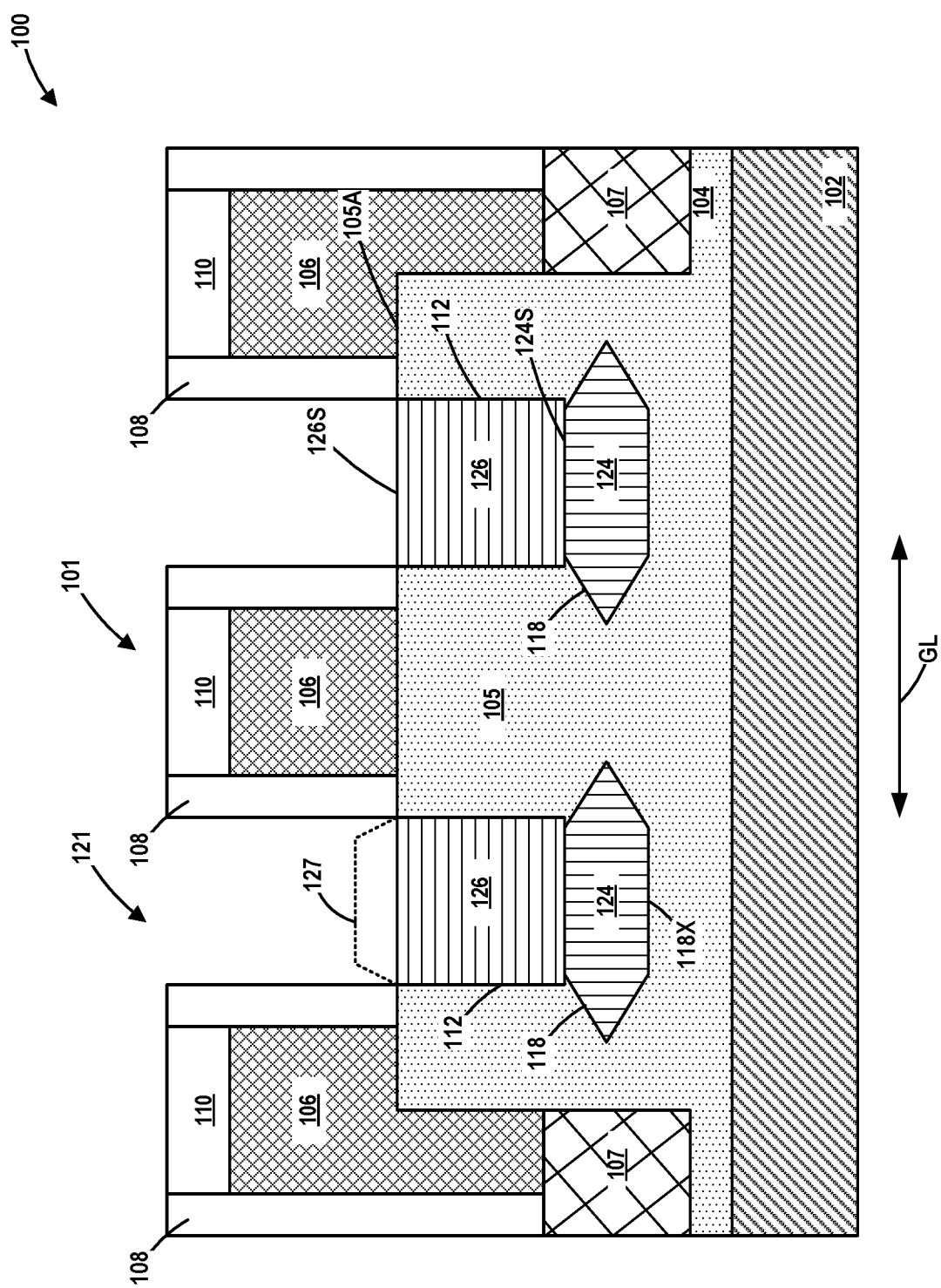

FIG. 8 depicts the transistor device 101 after several process operations were performed. First, an etching process was performed to remove the internal sidewall spacer 114A and to clean the sidewall of the upper epitaxial cavities 112 of the first and second overall epitaxial cavities 121. Thereafter, another epitaxial growth process was performed to form simplistically depicted stressed epitaxial semiconductor material 126 in the upper epitaxial cavities 112 and on and in contact with the previously formed counter-doped epitaxial semiconductor material 124. The epitaxial material 126 may be formed with any desired type of stress, e.g., (tensile for NFET devices or compressive for PFET devices). The epitaxial semiconductor material 126 may comprise any of a variety of different semiconductor materials. For example, for a PFET transistor device 101, the epitaxial semiconductor material 126 may comprise silicon, etc. For an NFET transistor device 101, the epitaxial semiconductor material 126 may also comprise silicon, etc. However, the epitaxial semiconductor material 126 will be doped with a dopant type that is the same as the type (N or P) of the transistor device 101. For example, in the case where the transistor device 101 is a PFET device, the epitaxial semiconductor material 126 will be doped with a P-type dopant, e.g., boron, boron difluoride. In the case where the transistor device 101 is an NFET device, the epitaxial semiconductor material 126 will be doped with an N-type dopant, e.g., phosphorus, arsenic. Stated another way, the epitaxial semiconductor material 126 will be doped with a dopant type (N or P) that is opposite to the dopant type (N or P) present in the epitaxial semiconductor material 124. Additionally, the epitaxial semiconductor material 126 will be doped with a dopant type (N or P) that is the opposite of the dopant type (N or P) that is used to dope the well region 104. As before, the epitaxial semiconductor material 126 may be doped in situ, i.e., during the epitaxial growth process, or it may be doped by performing an ion implantation process. The concentration of dopant atoms in the epitaxial semiconductor material 126 as well as the location of peak concentration of dopant atoms may vary depending upon the particular application, as was discussed above in connection with the epitaxial semiconductor material 120. In the depicted example, the second epitaxial growth process is controlled such that the upper surface 126S of the epitaxial semiconductor material 126 is approximately level with the upper surface 105A of the fin 105. In other cases, the epitaxial semiconductor material 126 may be grown in such a manner that it has an upper surface 127 (depicted in dashed lines) that is positioned above the upper surface 105A of the fin 105, i.e., raised source/drain regions. As discussed elsewhere herein, and as illustrated in FIG. 18, the upper surface 107A of the isolation structure 107 is positioned at a location that is approximately level with a midpoint of the vertical thickness of the counter-doped epitaxial semiconductor material 124. The location of peak dopant concentration may be at approximately the midpoint of the vertical thickness of the counter-doped epitaxial semiconductor material 124.

Figure 9:
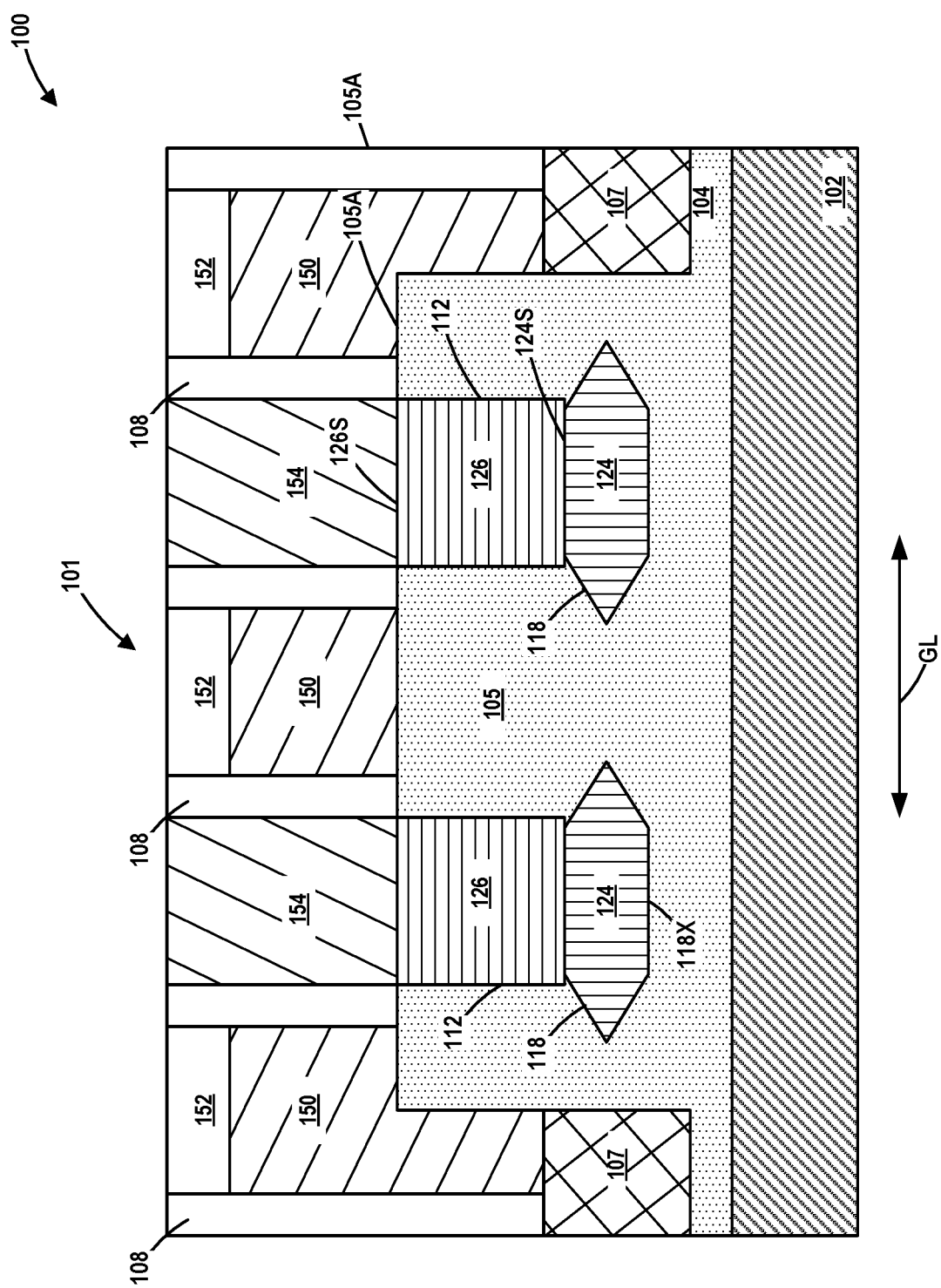

FIG. 9 depicts the product 100 after several known manufacturing techniques were performed to form one or more layers of insulation material 154 on the product, to remove the gate caps 110 and the sacrificial gate structures 106 and to form simplistically depicted final gate structures 150 and final gate caps 152 in their place. Note that a portion of the counter-doped epitaxial semiconductor material 124 positioned in each of the lower epitaxial cavities 118 is positioned vertically under a portion of the final gate structure 150 (see, e.g., the dimension 119 in FIG. 6).

Formation of the first and second overall epitaxial cavities 121 with the above-described unique configuration permits a relatively larger volume of stressed epitaxial material to be formed in the first and second overall epitaxial cavities 121. As a result of this relatively larger volume of stressed epitaxial material, a desired stress profile may be imparted from the stressed epitaxial material to the channel region of the device 101 so as to improve the on-state current (Ion) without substantially increasing the off-state current (Ioff). Additionally, the presence of the counter-doped regions 124 results in a shift of the threshold voltage of the device 100 as demonstrated by TCAD simulations. More specifically, the shift in the threshold voltage of a PFET device was a function of the doping concentration (e.g., phosphorous). In one illustrative TCAD simulation, the threshold voltage of the device increased as high as about 25 mV when the counter-doped regions 124 were doped with phosphorous at a concentration of about 1E21—a sufficient magnitude difference between low voltage (LVT) devices and super low voltage (SLVT) devices in high performance (HP) applications such as, for example, microprocessors for graphic card or microprocess for server applications which the microprocessor is dominated by SLVT devices in speed-related units while other units of the microprocessor use LVT devices. In the case of NFET devices, the shift in threshold voltage may be lower than for a PFET device. Thus, the present devices and methods provide a means for "tuning" the threshold voltages of both NFET and PFET devices that is becoming more difficult with the prior art techniques noted in the background section of this application. More specifically, given the very small gate length dimensions, it is becoming increasingly difficult to modify the threshold voltage of a transistor by adding additional work function metals (e.g., TiN) within the gate cavity when using replacement gate manufacturing technique. Additionally, given the constantly decreasing fin pitch (and gate pitch) on FinFET devices, it is increasingly difficult to achieve any meaningful shift in the threshold voltage of the device by means of traditional counter-doped HALO implant regions formed by angled ion implantation techniques. In some cases, the formation of the counter-doped regions 124 may eliminate the need for performing HALO implantation processes at all, thereby saving the formation of various ion implantation masks, which should lead to reduced manufacturing costs.

At the point of processing depicted in FIG. 9, traditional manufacturing operations may be performed to complete the transistor device 101, i.e., the formation of multiple layers of insulating material and various conductive structures that are conductively coupled to the source region, the drain region and the final gate structure 150 of the transistor device 101. The techniques involved in forming these conductive structures are well known to those skilled in the art.

Figure 10:
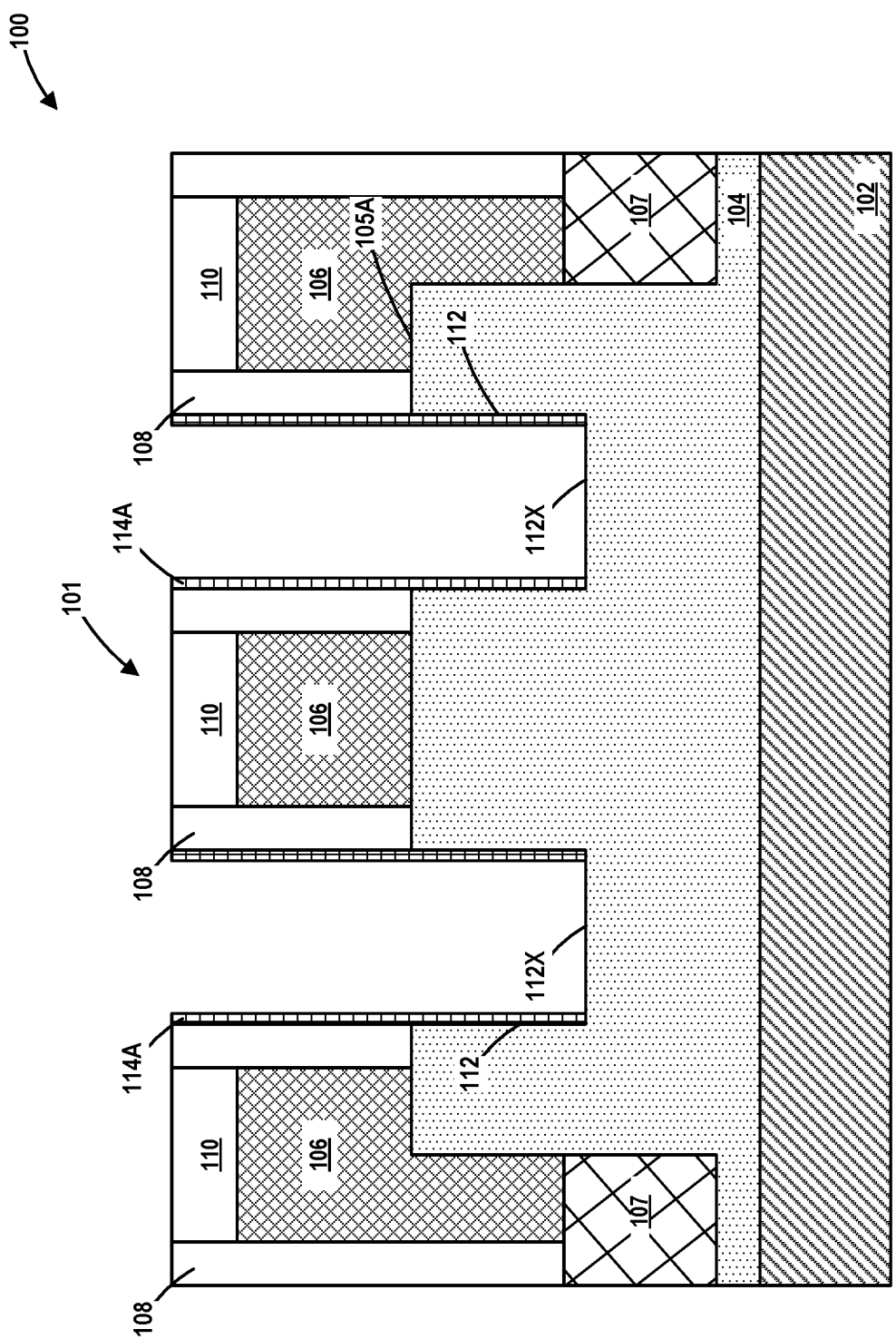
Figure 11:
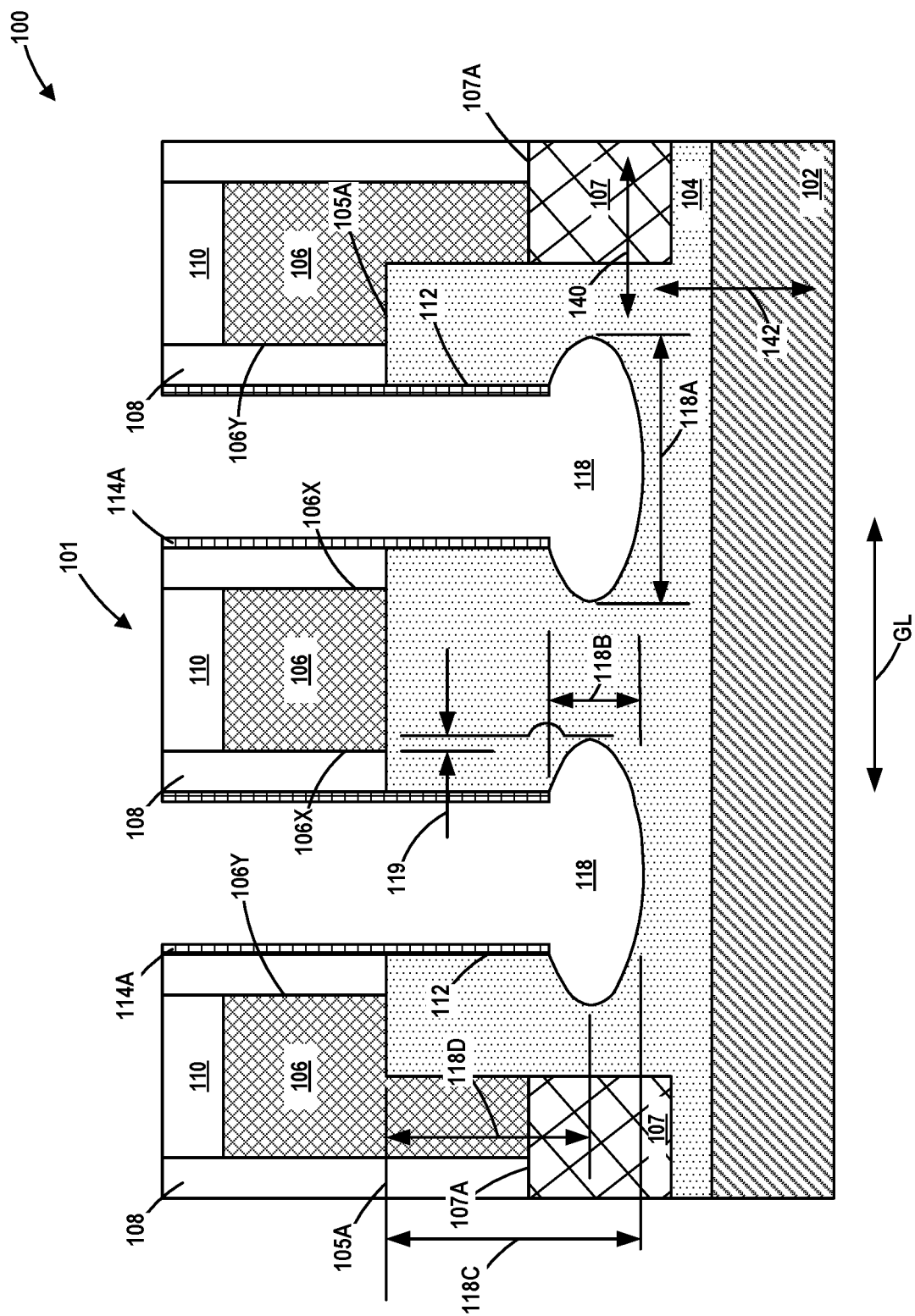
Figure 12:
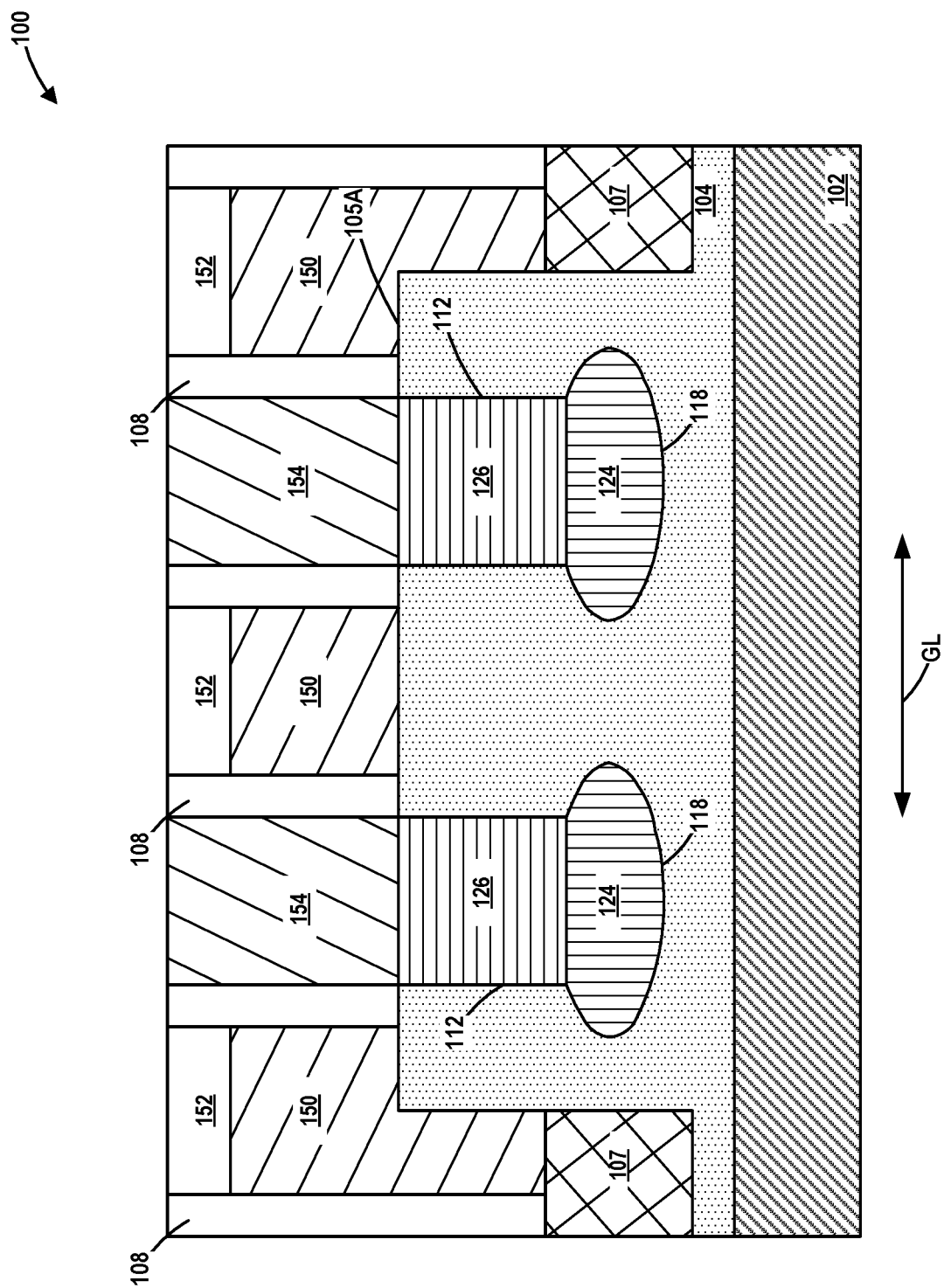

As noted above, the first and second overall epitaxial cavities 121 (e.g., the combination of the lower epitaxial cavity 118 and upper epitaxial cavity 112) may have a variety of different configurations. FIGS. 10-12 depict another illustrative embodiment wherein the lower epitaxial cavity 118 of the first and second overall epitaxial cavities 121 has a generally rounded or oval configuration. In one particular example, the oval or rounded lower epitaxial cavity 118 may have dimensions substantially similar to those described above for the sigma-shaped (or diamond-shaped) lower epitaxial cavity 118. In some applications, the upper surface 107A of the isolation structure 107 may be positioned at a location that is approximately level with a midpoint of the vertical thickness 118B of the oval or rounded lower epitaxial cavity 118 shown in FIG. 11. Positioning the upper surface 107A of the isolation structure 107 relative to the lower epitaxial cavity 118 as described in the previous sentence may lead to improved device performance.

FIG. 10 depicts the transistor device 101 at a point in processing that corresponds to that shown in FIG. 4, i.e., after formation of the upper epitaxial cavities 112 and the internal sidewall spacer 114A.

FIG. 11 depicts the product after one or more etching processes were performed to form the oval or rounded lower epitaxial cavity 118. The etching process(es) used to form the lower epitaxial cavity 118 may have both isotropic and anisotropic characteristics. The overall size of the lower epitaxial cavity 118 may vary depending upon the particular application.

FIG. 12 depicts the product 100 after several of the above-described process steps were performed, i.e., the counter-doped epitaxial semiconductor material 124 was formed in the lower epitaxial cavities 118, the internal sidewall spacer 114A was removed and the stressed epitaxial semiconductor material 126 was formed in the upper epitaxial cavities 112 and on and in contact with the previously formed counter-doped epitaxial semiconductor material 124. FIG. 12 also depicts the product after formation of the simplistically depicted final gate structures 150 and final gate caps 152. As before, a portion of the counter-doped epitaxial semiconductor material 124 positioned in each of the lower epitaxial cavities 118 is positioned vertically under a portion of the final gate structure 150.

Figure 13:
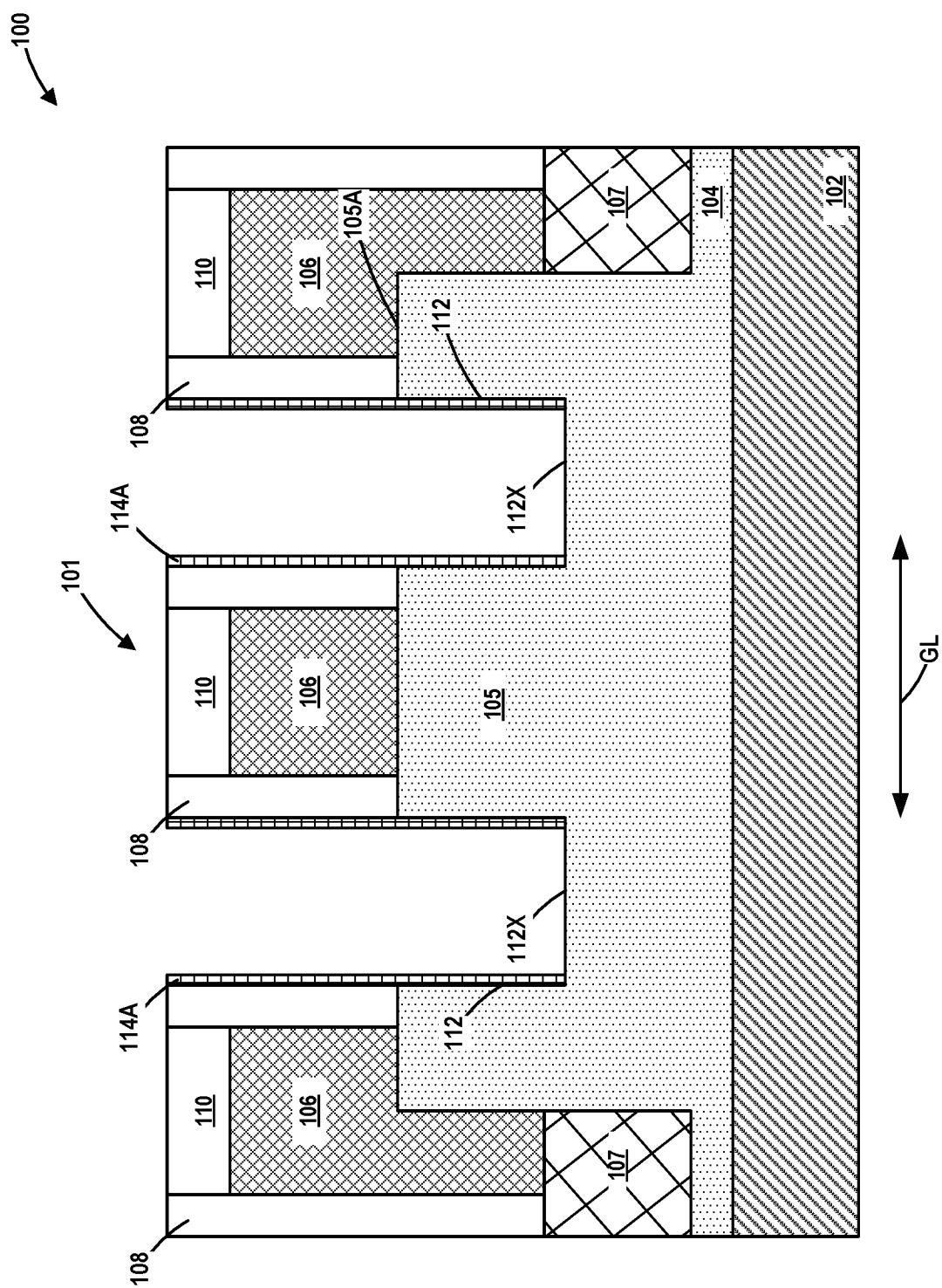

FIGS. 13-17 depict another illustrative embodiment wherein the first and second overall epitaxial cavities 121 have a substantially uniform configuration throughout the depth of the first and second overall epitaxial cavities 121. FIG. 13 depicts the transistor device 101 at a point in processing that corresponds to that shown in FIG. 4, i.e., after formation of the upper epitaxial cavities 112 and the internal sidewall spacer 114A.

Figure 14:
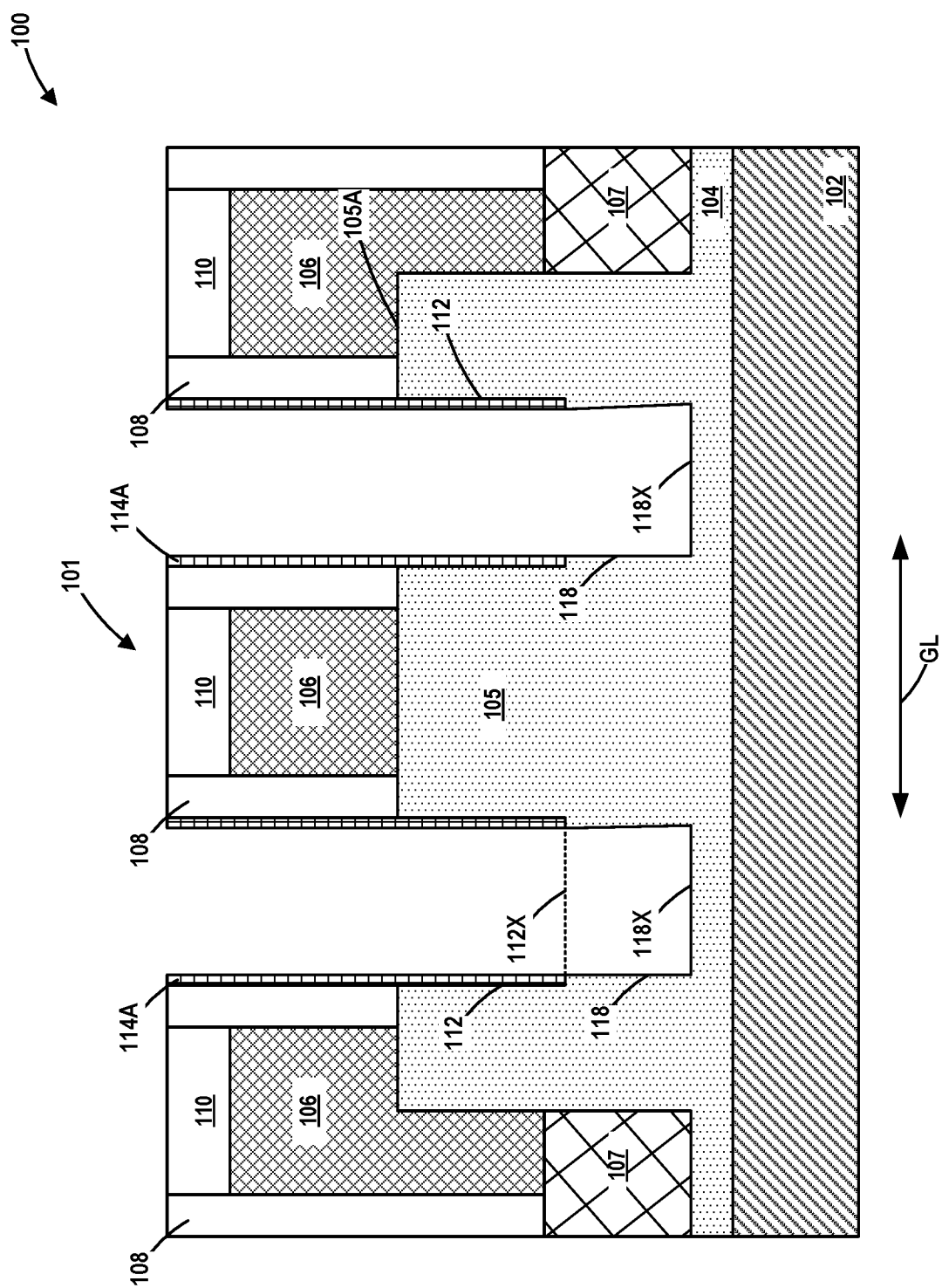

FIG. 14 depicts the transistor device 101 after another anisotropic etching process was performed to form a lower epitaxial cavity 118 below each of the upper epitaxial cavities 112. As depicted, in one illustrative embodiment, the epitaxial cavities 118 are substantially self-aligned with respect to the internal sidewall spacer 114A within each of the upper epitaxial cavities 112, and the epitaxial cavities 118 effectively extend the depth of the upper epitaxial cavities 112. The epitaxial cavities 118 have a bottom surface 118X that is positioned at a level within the substrate 102 below the bottom surface 112X of the upper epitaxial cavities 112. In one illustrative example, the difference in the vertical position of the bottom surface 112X of the upper epitaxial cavities 112 and the bottom surface 118X of the epitaxial cavities 118 may be about 10-40 nm, based upon current-day technology.

Figure 15:
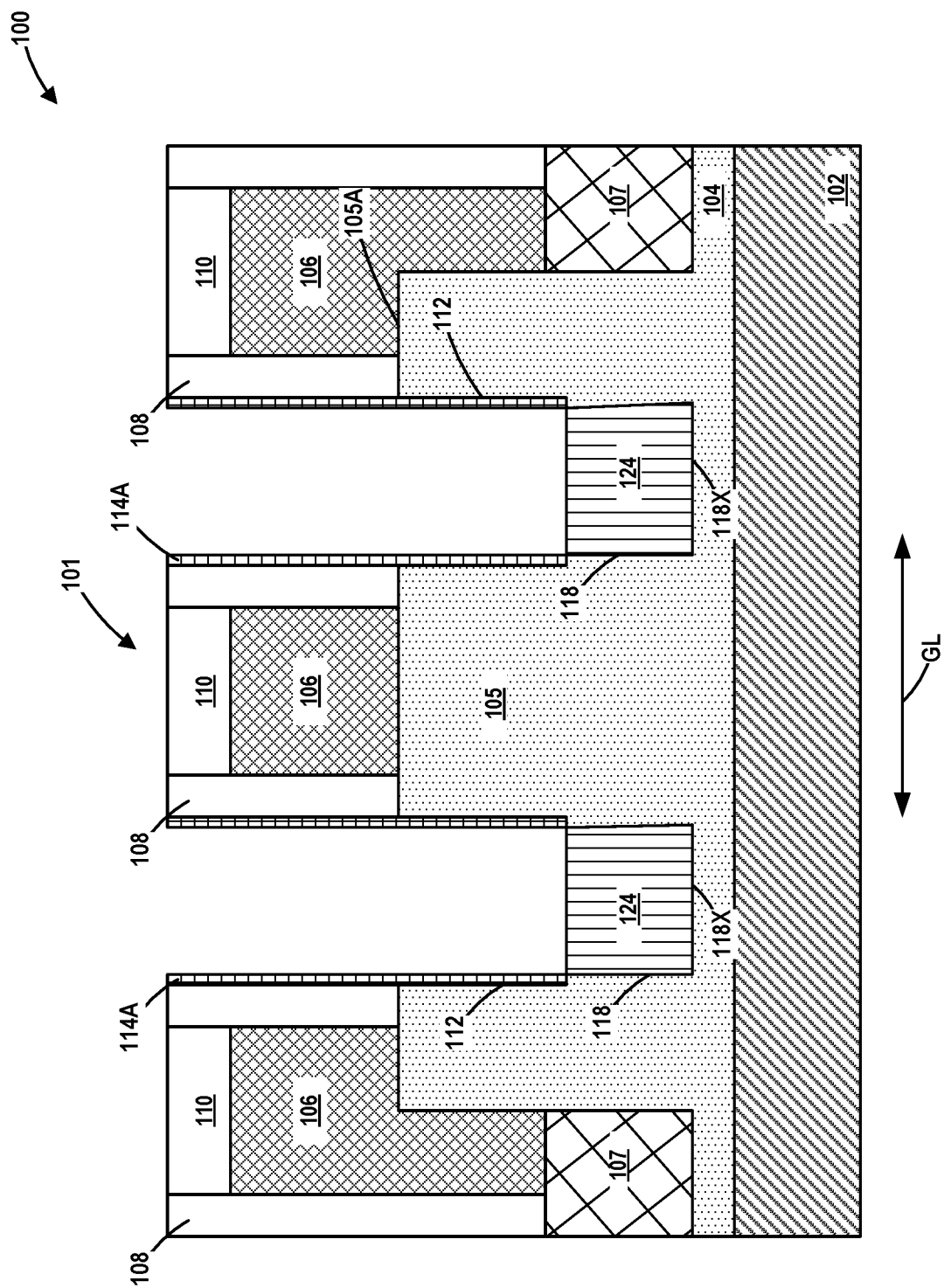

FIG. 15 depicts the product 100 after the above-described counter-doped epitaxial semiconductor material 124 was formed in the lower epitaxial cavities 118.

Figure 16:
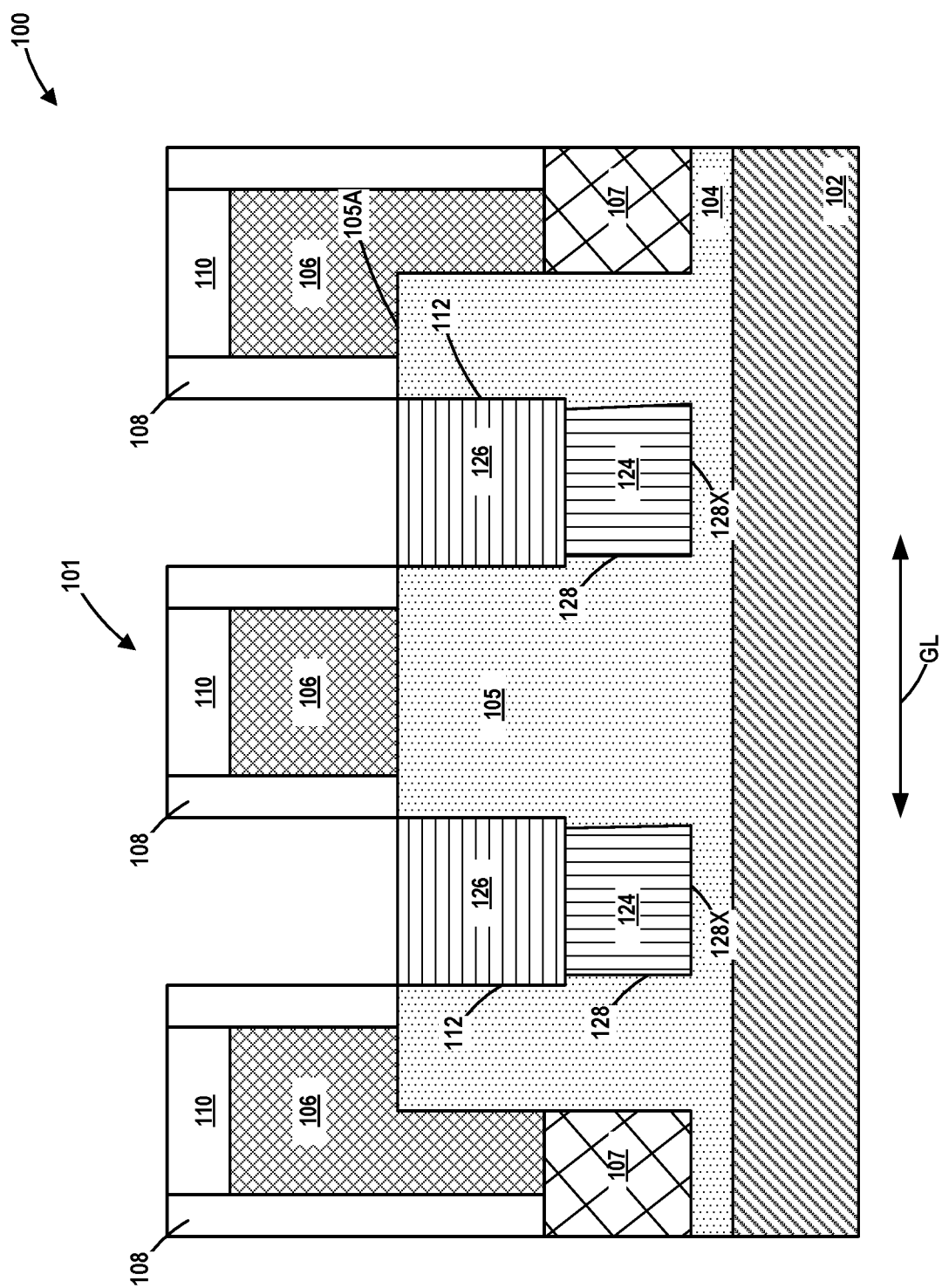

FIG. 16 depicts the product after the above-described internal sidewall spacer 114A was removed and after the epitaxial semiconductor material 126 was formed in the upper epitaxial cavities 112 and on and in contact with the previously formed counter-doped epitaxial semiconductor material 124.

Figure 17:
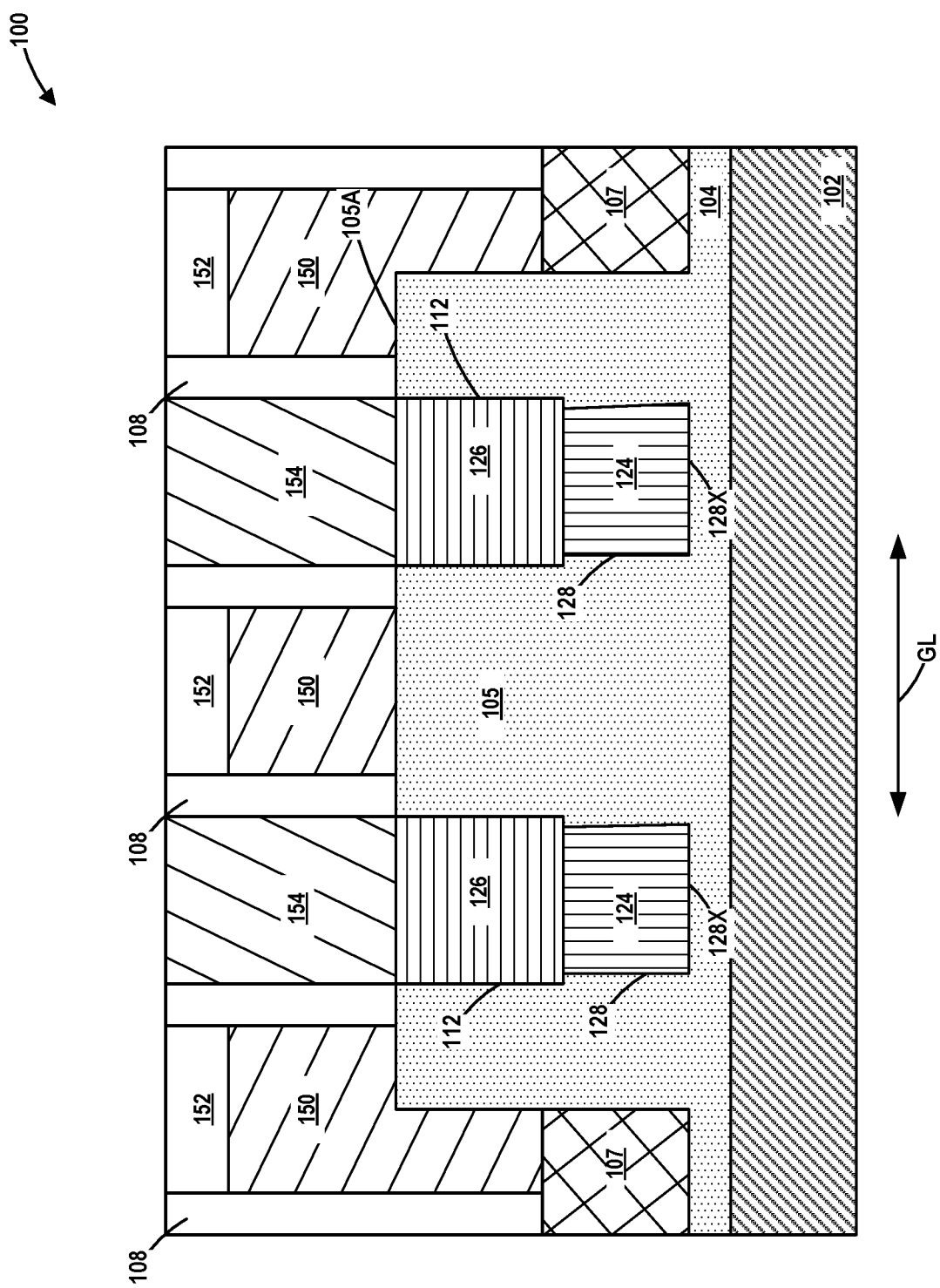

FIG. 17 depicts the product after formation of the simplistically depicted final gate structures 150 and final gate caps 152. In this illustrative embodiment, a portion of the counter-doped epitaxial semiconductor material 124 positioned in each of the lower epitaxial cavities 118 is not positioned vertically under a portion of the final gate structure 150, but that may not be the case in all applications.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is there-fore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor of a first dopant type, comprising:
    a gate structure positioned above a semiconductor substrate;
    first and second epitaxial cavities formed in the semiconductor substrate on opposite sides of the gate structure, wherein each of the first and second epitaxial cavities includes a lower epitaxial cavity having a sigma-shaped cross-sectional configuration;
    a counter-doped epitaxial semiconductor material positioned proximate a bottom of each of the first and second epitaxial cavities, wherein the counter-doped epitaxial semiconductor material is doped with a second dopant type that is opposite to the first dopant type;
    a same-doped epitaxial semiconductor material positioned in each of the first and second epitaxial cavities above the counter-doped epitaxial semiconductor material, wherein the same-doped epitaxial semiconductor material is doped with a dopant of the first dopant type; and
    an isolation structure positioned in the semiconductor substrate adjacent the lower epitaxial cavity, wherein the counter doped epitaxial semiconductor has a vertical thickness, and an upper surface of the isolation structure is approximately coplanar with a midpoint of the vertical thickness of the counter-doped epitaxial semiconductor material.

2. The transistor of claim 1, wherein, when viewed in a cross-section taken through each of the first and second epitaxial cavities in a direction corresponding to a gate length direction of the transistor, the first and second epitaxial cavities have a substantially uniform width in the gate length direction for substantially an entire depth of the first and second epitaxial cavities.

3. The transistor of claim 1, wherein each of the first and second epitaxial cavities comprises a substantially vertically oriented upper epitaxial cavity that extends from an upper surface of the semiconductor substrate to the lower epitaxial cavity, and wherein a lateral width of the lower epitaxial cavity in a gate length direction of the transistor is greater than a lateral width of the substantially vertically oriented upper epitaxial cavity in the gate length direction and wherein the counter-doped epitaxial semiconductor material is positioned in at least a portion of the lower epitaxial cavity.

4. The transistor of claim 3, wherein, for each of the first and second epitaxial cavities, a portion of the counter-doped epitaxial semiconductor material positioned in the lower epitaxial cavity is positioned vertically under a portion of the gate structure.

5. The transistor of claim 1, wherein the transistor is a P-type transistor and wherein the transistor further comprises an N-doped well region positioned in the semiconductor substrate, wherein the counter-doped epitaxial semiconductor material positioned in each of the first and second epitaxial cavities is doped with an N-type dopant and the counter-doped epitaxial semiconductor material is positioned within the N-doped well region.

6. The transistor of claim 1, wherein the transistor is an N-type transistor and wherein the transistor further comprises a P-doped well region positioned in the semiconductor substrate, wherein the counter-doped epitaxial semiconductor material positioned in each of the first and second epitaxial cavities is doped with a P-type dopant and the counter-doped epitaxial semiconductor material is positioned within the P-doped well region.

7. The transistor of claim 3, wherein the counter-doped epitaxial semiconductor material is positioned entirely within the lower epitaxial cavity and the same-doped epitaxial semiconductor material is positioned entirely within the substantially vertically oriented upper epitaxial cavity.

8. The transistor of claim 1, wherein the counter-doped epitaxial semiconductor material and the same-doped epitaxial semiconductor material are made of a same semiconductor material.

9. The transistor of claim 1, wherein the counter-doped epitaxial semiconductor material is positioned on and in contact with a bottom surface of the first and second epitaxial cavities.

10. A transistor of a first dopant type, comprising:
    a gate structure positioned above a semiconductor substrate;
    first and second epitaxial cavities formed in the semiconductor substrate on opposite sides of the gate structure, wherein, when viewed in a cross-section taken through each of the first and second epitaxial cavities in a direction corresponding to a gate length direction of the transistor, the first and second epitaxial cavities have a substantially uniform width in the gate length direction for substantially an entire depth of the first and second epitaxial cavities,
    wherein each of the first and second epitaxial cavities comprises a lower epitaxial cavity having a sigma-shaped cross-sectional configuration;

a counter-doped epitaxial semiconductor material positioned on and in contact with a bottom surface of each of the first and second epitaxial cavities, wherein the counter-doped epitaxial semiconductor material is doped with a second dopant type that is opposite to the first dopant type;

a same-doped epitaxial semiconductor material positioned in each of the first and second epitaxial cavities and on and in contact with the counter-doped epitaxial semiconductor material, wherein the same-doped epitaxial semiconductor material is doped with a dopant of the first dopant type; and an isolation structure positioned in the semiconductor substrate adjacent the lower epitaxial cavity, wherein the counter doped epitaxial semiconductor material has a vertical thickness, and an upper surface of the isolation structure is approximately coplanar with a midpoint of the vertical thickness of the counter-doped epitaxial semiconductor material.

11. A transistor of a first dopant type, comprising:

a gate structure positioned above a semiconductor substrate;

first and second epitaxial cavities formed in the semiconductor substrate on opposite sides of the gate structure, each of the first and second epitaxial cavities comprising a substantially vertically oriented upper epitaxial cavity and a lower epitaxial cavity having a sigma-shaped cross-sectional configuration, wherein the substantially vertically oriented upper epitaxial cavity extends from an upper surface of the semiconductor substrate to the lower epitaxial cavity and wherein a lateral width of the lower epitaxial cavity in a gate length direction of the transistor is greater than a lateral width of the substantially vertically oriented upper epitaxial cavity in the gate length direction;

a counter-doped epitaxial semiconductor material positioned in at least a portion of the lower epitaxial cavity proximate a bottom of each of the first and second epitaxial cavities, wherein the counter-doped epitaxial semiconductor material is doped with a second dopant type that is opposite to the first dopant type, wherein the counter-doped epitaxial semiconductor material has a vertical thickness and a peak dopant concentration of the second dopant type approximately at a midpoint of the vertical thickness of the counter-doped epitaxial semiconductor material;

a same-doped epitaxial semiconductor material positioned in each of the first and second epitaxial cavities on and in contact with the counter-doped epitaxial semiconductor material, wherein the same-doped epitaxial semiconductor material is doped with a dopant of the first dopant type; and an isolation structure positioned in the semiconductor substrate adjacent the lower epitaxial cavity, wherein an upper surface of the isolation structure is approximately coplanar with the midpoint of the vertical thickness of the counter-doped epitaxial semiconductor material.

12. The transistor of claim 11, wherein, for each of the first and second epitaxial cavities, a portion of the counter-doped epitaxial semiconductor material positioned in the lower epitaxial cavity is positioned vertically under a portion of the gate structure.

13. The transistor of claim 11, wherein the counter-doped epitaxial semiconductor material is positioned entirely within the lower epitaxial cavity and the same-doped epitaxial semiconductor material is positioned entirely within the substantially vertically oriented upper epitaxial cavity.

* * * * *

UNITED STATES PATENT AND TRADEMARK OFFICE
CERTIFICATE OF CORRECTION

| | | |
|---|---|---|
| PATENT NO. | : 11,362,177 B2 | Page 1 of 1 |
| APPLICATION NO. | : 16/774157 | |
| DATED | : June 14, 2022 | |
| INVENTOR(S) | : Arkadiusz Malinowski et al. | |

It is certified that error appears in the above-identified patent and that said Letters Patent is hereby corrected as shown below:

In the Specification

In Column 3, the third paragraph reads "FIGS. 1-17 depict various embodiments of an integrated..." but it should read "FIGS. 1-18 depict various embodiments of an integrated..."

In Column 10, the fifth paragraph reads "FIGS. 13-17 depict another illustrative embodiment..." but it should read "FIGS. 13-18 depict another illustrative embodiment..."

Signed and Sealed this
Ninth Day of August, 2022

Katherine Kelly Vidal
*Director of the United States Patent and Trademark Office*